United States Patent
Bath et al.

[11] Patent Number: 5,909,149
[45] Date of Patent: Jun. 1, 1999

[54] MULTIBAND PHASE LOCKED LOOP USING A SWITCHED VOLTAGE CONTROLLED OSCILLATOR

[75] Inventors: Gareth Bath, Blandon; Jorgen Bojer, Fleetwood, both of Pa.

[73] Assignee: Lucent Technologies, Inc., Murray Hill, N.J.

[21] Appl. No.: 08/924,723

[22] Filed: Aug. 29, 1997

[51] Int. Cl.[6] .......................... H03L 7/089; H03L 7/099; H03L 7/18

[52] U.S. Cl. .................................. 331/2; 331/14; 331/16; 331/17; 331/25

[58] Field of Search .................................. 331/2, 14, 16, 331/25, 17

[56] References Cited

U.S. PATENT DOCUMENTS

| | | | |
|---|---|---|---|
| 4,510,461 | 4/1985 | Dickes et al. ................................ | 331/2 |
| 5,339,050 | 8/1994 | Llewellyn .................................. | 331/16 |
| 5,625,325 | 4/1997 | Rotzoll et al. ............................. | 331/16 |
| 5,686,864 | 11/1997 | Martin et al. ................................ | 331/2 |

*Primary Examiner*—Siegfried H. Grimm
*Attorney, Agent, or Firm*—Synnestvedt & Lechner LLP

[57] ABSTRACT

A multi-band phase locked loop employing multiple, switchable voltage controlled oscillators. A single PLL is provided having a different voltage controlled oscillator for each desired frequency band of operation. The transfer function of the phase detector in the phase locked loop is switched responsive to the particular band selected so as to maintain the loop natural frequency at the same point regardless of other changes in the loop transfer function that are associated with operating at alternate frequencies, such as, but not limited to, changes in the frequency slope of the voltage controlled oscillators and changes in the division ratio of the loop divider circuit.

26 Claims, 2 Drawing Sheets

(BAND₁, BAND₂)
BAND SELECT

MULTIBAND PHASE LOCKED LOOP USING A SWITCHED VOLTAGE CONTROLLED OSCILLATOR

FIELD OF THE INVENTION

The invention pertains to phase locked loops. More particularly, the invention pertains to phase locked loops for use with multiple spaced frequency bands.

BACKGROUND OF THE INVENTION

Phase locked loops have varied and wide applications in communications equipment and other fields. Specifically, they can be used wherever it is necessary to synchronize the phase and/or frequency of two signals. In a typical communications type application, a phase locked loop (PLL) is used to synchronize a local oscillator to the frequency (or phase) of an incoming data signal. Phase locked loops also are used to tune a high frequency local oscillator itself to a separate, more stable, lower frequency local oscillator. For instance, in certain communications applications such as digital telecommunications applications, a very high frequency voltage controlled oscillator (VCO) signal may be necessary for synchronizing to an incoming radio frequency signal at, for example, 800 MHz. In order to very precisely control the frequency of the high frequency VCO, the VCO itself may be in a phase locked loop with a crystal oscillator, since crystal oscillators tend to be extremely accurate. However, crystal oscillators typically do not operate at high enough frequencies to be used directly for high radio frequency applications.

In the telecommunications field, incoming data or voice signals are FM modulated on a radio frequency (RF) carrier frequency of, for example, 800 MHz. The incoming data signal is brought down to the base band frequency, e.g., 0–4 KHz, in two steps. First it is frequency down converted into an intermediate frequency e.g., 70 MHz, and then the intermediate frequency (IF) signal is further down converted to the base band. Commonly, the 800 MHz RF signal is converted down to the IF frequency by means of heterodyning the incoming signal with a local oscillator signal that differs from the RF carrier frequency by an amount equal to the intermediate frequency. Thus, in the present example, a local oscillator operating at 870 MHz is needed. Since crystal oscillators that operate at such high frequencies typically are not available, it is common to utilize a voltage controlled oscillator for generating the 870 MHz local oscillator signal. However, since voltage controlled oscillators require highly accurate voltage control to maintain the local oscillator frequency with precision, the high frequency VCOs typically are embedded within a phase locked loop with a crystal oscillator operating at a much lower frequency.

Because the frequency bands dedicated to cellular telephone communications have rapidly become overloaded with communication traffic, both North America and Europe have recently added new radio frequency (RF) band ranges dedicated for cellular telephone communications. Particularly, in North America, where the 824–894 MHz band has been dedicated to cellular telephone communication use, the 1850–1990 MHz band has been added as a second cellular telephone communication band. In Europe, where 890–960 MHz has been dedicated to cellular telephone communications, 1710–1780 MHz has been added as a second frequency band for cellular telephone communications. Within each band there are a number of channels spaced at, for example, 200 KHz intervals so that multiple telephone calls can be supported in the same geographic cell simultaneously.

In view of these new bands for cellular telephone communications, there is a need for cellular telephones and other cellular communications equipment, including facsimile machines, pagers, wireless PCs, wireless modems, etc., that can receive and transmit signals within two separate RF carrier frequency bands, e.g., 824–894 MHz and 1850–1990 MHz.

Accordingly, there is a need for local oscillators which can operate at two very different RF frequencies. For instance, assuming a 70 MHz intermediate frequency, in order for a cellular telephone to be able to receive and transmit data in either band, it should be capable of generating a local oscillator signal in the 894–964 MHz range and a local oscillator signal in the 1920–2060 MHz range. However, while it is not difficult to produce an oscillator capable of generating signals at different frequencies within a tight band, such as 894–964 MHz or 1920–2060 MHz, it is not practical to produce a single oscillator that can produce signals over so broad a range as to cover 894–2060 MHz. Accordingly, multi-band operation requires special design considerations.

One method of providing multi-band capability is to simply provide two individual phase locked loops, one capable of generating local oscillator signals in the 1920–2060 MHz band and the other capable of generating local oscillator signals in the 894–964 MHz band. However, when switching from one band to the other in such a system, there is necessarily a start-up delay while the capacitors and other circuit components of the PLL charge up. In other words, when the telephone switches from one PLL to the other, there will be a long initial settling period before the VCO in the newly activated PLL locks to the desired frequency. Another disadvantage of this solution is that the use of two PLLs increases the circuit componentry in the telephone and thus also increases the size, weight and cost of the equipment.

Another option is to choose an intermediate frequency for the transceiver that is precisely halfway between the two possible operation bands, i.e., in our example in which the two bands are 824–894 MHz and 1850–1990 MHz, the intermediate frequency would be 1350 MHz. In this manner, only a single band PLL is necessary. However, such an IF frequency constraint, particularly at such a high frequency, can lead to significant overall architectural difficulties and disadvantages.

Accordingly, it is an object of the present invention to provide an improved multi-band phase locked loop.

It is another object of the present invention to provide a multi-band phase locked loop with optimal dynamics and close-in-phase-noise with minimal voltage controlled oscillator tuning voltage.

It is a further object of the present invention to provide a multi-band phase locked loop with maximized voltage controlled oscillator frequency slope.

It is yet a further object of the present invention to provide a multi-band phase locked loop with minimal additional circuitry for handling multiple bands.

It is yet another object of the present invention to provide a multi-band phase locked loop with minimal start-up-lock time upon switching from a first voltage controlled oscillator to another voltage controlled oscillator.

SUMMARY OF THE INVENTION

The invention is a phase locked loop with multiple VCOs, one VCO for each frequency band, that can be selectively and alternately coupled into the loop. Given that the natural frequency of a phase locked loop is a direct function of the individual transfer functions of the phase detector, loop filter, voltage controlled oscillator and divider circuit, the natural frequency of the loop is maintained at a single point for any number of frequency bands by switching the transfer function of the phase detector to compensate for any change in the transfer functions of the other circuit components in the loop when frequency band is changed. In most cases, the change in the divide-by ratio of the loop divider circuit that will accompany a change in band will have the most significant effect on the natural frequency of the loop.

The transfer function of the phase detector can be altered, for example, by altering the magnitude of the current source (s) in the phase detector in unison with the switching of bands. In a preferred embodiment, the switching of the current sources is directly responsive to the band select signal.

Alternately, the transfer functions of the various VCOs themselves can be selected so that each VCO transfer function maintains the same natural frequency of the overall loop relative to the change in the divide-by ratio of the loop divider circuit (or any other changes to the overall loop transfer function). This can be accomplished by appropriate selection of the VCO frequency slope (i.e., MHz per volt).

DETAILED DESCRIPTION OF PREFERRED EMBODIMENTS OF THE INVENTION

Figure 1:
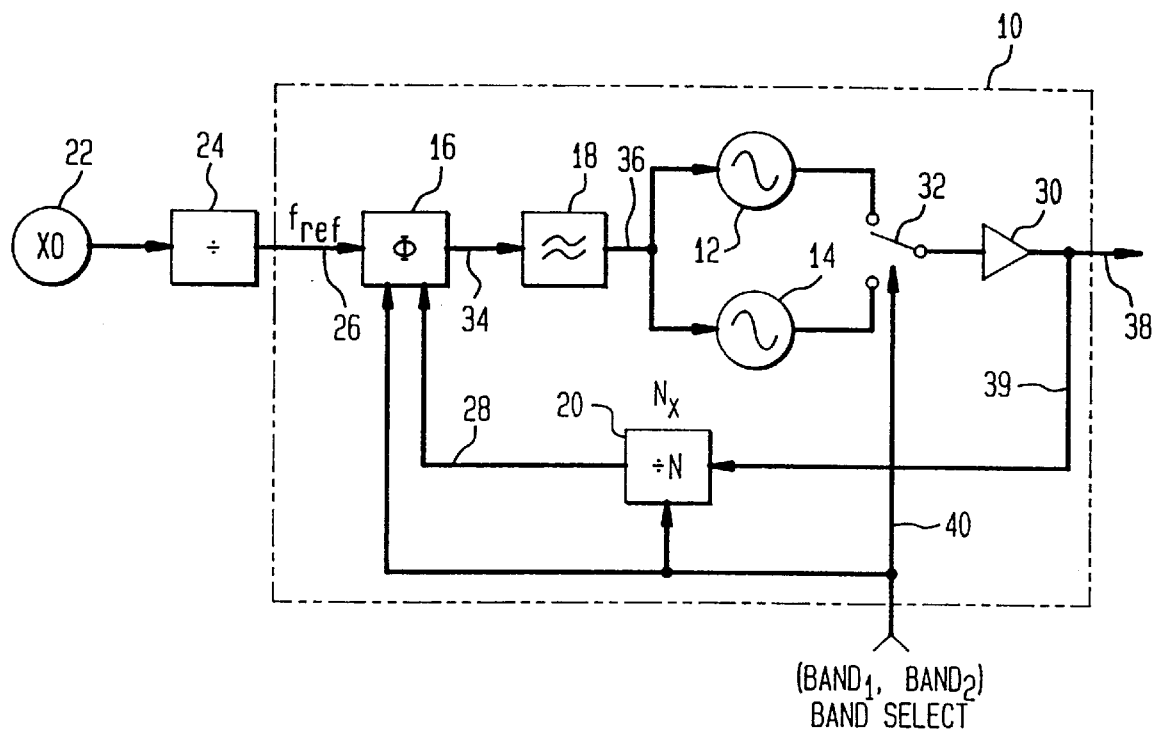
FIG. 1 is block diagram of a multi-band phase locked loop in accordance with the present invention.

FIG. 1 is a block diagram of an exemplary circuit including a phase locked loop in accordance with the present invention. The phase locked loop is shown at 10. It is a single phase locked loop with multiple VCOs, such as illustrated by VCOs 12 and 14, that can be alternately switched into the loop depending on the band. In operation, the PLL 10 locks the phase of the selected VCO 12 or 14 in synchronism with the reference signal 26 that is input to the PLL 10.

As shown, the reference signal is taken from a crystal oscillator 22 which, preferably, is a temperature controlled crystal oscillator. Divider 24 may or may not be necessary to provide a suitable reference frequency $f_{ref}$ on input line 26. A phase detector 16 compares the phase of the reference signal $f_{ref}$ on line 26, with a feedback signal on line 28. The feedback signal on line 28 is the conditioned output signal of the selected voltage controlled oscillator 12 or 14. The signal output of the selected VCO is fed back to the phase detector 16 through a buffer amplifier 30 and a programmable divide-by-N divider circuit 20. Switch 32 selects one of the two VCOs 12 or 14 responsive to a BAND SELECT signal indicating the receive band currently in operation.

The transfer function of a PLL is a function of the individual transfer functions of the loop circuitry, e.g., the phase detector 16, loop filter 18, VCO 12 or 14, and divider 20. In turn, the loop has a natural frequency, $\omega_n$, that is dictated by the loop transfer function. The natural frequency, $\omega_n$, should be precisely set so as to minimize the loop settling time and provide optimal loop performance. However, as the loop is switched between frequency bands, the transfer function of the loop will change. Most notably, the division ratio of the divider 20 would need to change dramatically. Also, the different VCOs 12 and 14 might have different transfer functions. Accordingly, the natural frequency of the loop also will change dramatically. Unless somehow "corrected", the natural frequency of the loop cannot be optimally set for more than one of the bands and, therefore, at least one of the bands will have a slower than acceptable settling time.

Further, since the damping coefficient of the loop is proportional to the natural frequency, it too will be changed from the optimal value. The close-in-phase-noise of the system is closely tied to the damping coefficient due to spectral peaking. Accordingly, it too will be set to a less than optimal value for at least one of the bands and, thus, the performance of the PLL will be significantly compromised for at least one of the bands. The changes in the natural frequency and damping coefficient caused by the much smaller changes in the divide-by ratio which occur when the equipment switches between channels within a single band are so small as not to create a concern.

Since the natural frequency of the phase locked loop is a direct function of the individual transfer functions of the phase detector, loop filter, voltage controlled oscillator and divider circuit, the present invention can maintain the natural frequency of the loop at a single optimized point for any number of frequency bands by switching the transfer function of the phase detector to compensate for any change in the transfer functions of the other circuit components in the loop when frequency band is changed. In most cases, the change in the divide-by ratio of the loop divider circuit that will accompany a change in band will have the most significant effect on the natural frequency of the loop.

In the embodiment shown in FIG. 1 where there are only two bands, and thus only two VCOs, the band select signal 40 may be a single bit signal with one level representing the first band, e.g. 824–894 MHz, and the other level signifying the second band, e.g. 1850–1990 MHz. Divider circuits 20 and 24 divide their respective input signals by an integer value selected so as to cause the signals on lines 26 and 28 which are to be compared to each other to have the same frequency so that a phase comparison can be made by phase detector 16. Phase detector 16 outputs a current pulse which is proportional to the difference in phase between the two compared signals on lines 26 and 28. The signal on line 34 is passed through a loop filter 18 prior to being supplied to the voltage controlled oscillators 12 and 14. The loop filter determines the band width of the loop and eliminates out-of-band noise, including, but not limited to, bleed through noise at the frequencies of the crystal oscillator 22, the VCOs 12 and 14, and the phase comparator 16.

The output of the loop filter is a voltage on line 36. As is well known, the VCOs 12 and 14 output a sinusoidal signal at a frequency within their band of operation dictated by the input voltage received on line 36. As previously mentioned, the output of the selected VCO is passed through switch 32 and buffer amplifier 30 and is the output signal of the buffer amplifier. Also as previously mentioned, the output of buffer amplifier 30 is looped back through divide-by-N circuit 20 to the phase detector 16 for comparison with the reference signal.

The dividers 20 and 24 allow the PLL to operate at a low frequency relative to the frequencies of the crystal oscillator 22 and the VCOs 12 and 14. This allows the VCO frequency to be programmed in steps of the phase comparison frequency within the VCO band. Most commonly, the phase comparison frequency is set to the channel separation within the bands, e.g., 200 KHz.

For purposes of the discussion herein, let us assume that the circuit shown in FIG. 1 is embodied in a cellular telephone in which the output signal on line 38 of the PLL is the local oscillator signal for the transceiver of a multi-band cellular telephone for use in North America and that the intermediate frequency of the telephone is 70 MHz. Accordingly, VCO 12 is intended to generate a sinusoidal output signal on line 38 in the 894–964 MHz band, while VCO 14 is intended to generate an output signal on line 38 in the 1920–2060 MHz band. Let us also assume that the dividers 20 and 24 are selected to set a phase detector comparison frequency of 200 KHz. Accordingly, the loop filter is set to have a cut off frequency much lower than 200 KHz to eliminate any reference comparison feedthrough.

Programmable divide-by-N circuit 20 is programmable between at least two division ratios, (i.e., two values of N) responsive to the band select signal 40. Particularly, the feedback signal 28 at the output of divider 20 must have a frequency of approximately 200 KHz. Of course, the divide-by-N circuit also is programmable between the various channels within each band responsive to a separate channel-select signal. However, in order to simplify the discussion, we shall assume one channel of operation in each band at 870 MHz and 1970 MHz, respectively. Thus, when VCO 12 is selected (having a desired output of 870 MHz); the division ratio $N_1$ for the first band is set to 870 MHz÷200 KHz=4,350. When VCO 14 (having a desired output frequency of 1970 MHz) is selected, the division ratio $N_2$ is set to 1970 MHz÷200 KHz=9,850. The ratio $N_2:N_1$, therefore, is 2.2644:1

Figure 2:
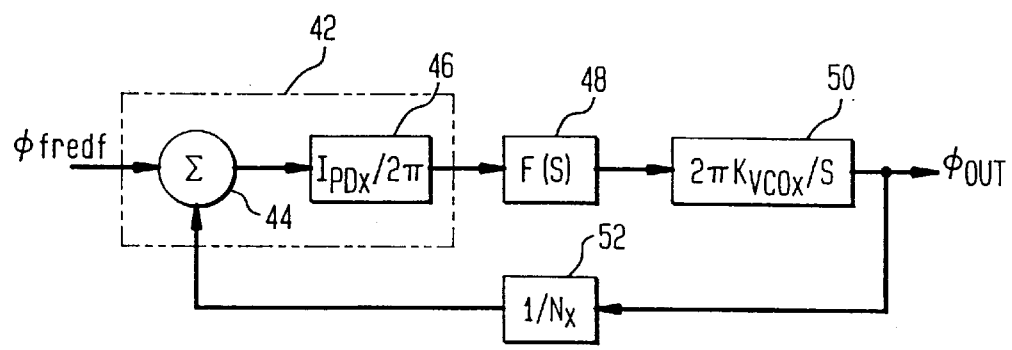
FIG. 2 is a block diagram illustrating the transfer function of the phase locked loop of FIG. 1.

FIG. 2 is a block diagram illustrating the transfer function of the phase locked loop shown in FIG. 1. With the contributions of the individual circuit elements represented by the different blocks. Block 42 represents the transfer function of the phase detector 16. Sub-block 44 represents the determination of the difference between the feedback signal and the reference signal. Block 46 presents the gain of the detector $I_{PDx}/2\Pi$, where x is a variable indicating the selected band. $I_{PDx}$, for example, may be 2.5 milliamps per $2\Pi$ radians.

The transfer function of the loop filter is represented in block 48 as function F(S), where S is the phase transfer function in the frequency domain. The capacitors in the loop filter 18 integrate the output current of the phase detector and the filter generates a voltage which is proportional in both magnitude and polarity to the phase difference between the feedback signal and the reference signal.

The transfer function of the selected VCO is shown in block 50 as $2\Pi K_{VCOx}/S$, where $K_{VCO}$ is the frequency slope of the VCO. The units of $K_{VCO}$ are Megahertz per volt (MHz/V).

The transfer function 52 of the divider circuit 20 is simply $1/N_x$.

In the PLL system illustrated by FIGS. 1 and 2, as in most PLL systems, the loop natural frequency $\omega_n$ can be generally expressed in the form $$\omega_n^2 = \frac{I_{PD} \cdot K_{VCO}}{C \cdot N} \qquad \text{Eq. 1}$$

where C is the integrating capacitance value in the system (contributed primarily by the loop filter 18).

The damping coefficient of the loop can be expressed as $$\rho = \frac{\omega_n}{2} \cdot \tau_s \qquad \text{Eq. 2}$$

where $\tau_s$ is the time constant of the loop filter F(S).

As can be seen from Equations 1 and 2 above, when the division ratio N is switched to accommodate the particular, selected VCO, the loop natural frequency $\omega_n$ is also changed in direct inverse proportion thereto. Thus, in our example, in which the two frequencies are 870 MHz and 1970 MHz, and wherein the ratio $n_2:n_1$ is 2.2644:1, the shifting of the loop natural frequency $\omega_n$ is significant since it varies as $$\left(\sqrt{n}\right)^{-1}$$

Furthermore, it can also be seen that the damping coefficient, $\rho$, changes directly proportionally to the change in $\omega_n$. Thus, if the transfer functions of the phase detector, filter and selected VCO are held constant, the natural frequency of the loop will be altered dramatically from band to band.

Thus, in accordance with the present invention, the $I_{PD}$ value of the phase detector 16 also is altered responsive to the band select signal 40. $I_{PD1}$ is selected when VCO 12 is in operation, i.e., when the 870 MHz band is selected (hereinafter Band1) and $I_{PD2}$ is selected when VCO 14 is selected, i.e., when the 1970 MHz band is selected (hereinafter Band2) The ratio of $I_{PD1}$ to $I_{PD2}$ is dictated in accordance with the equations below. Particularly, as previously described, $$\frac{f_{band1}}{N_1} = f_{ref} \qquad \text{Eq. 3}$$

and $$\frac{f_{band2}}{N_2} = f_{ref} \qquad \text{Eq. 4}$$

Thus, $$\frac{f_{Band1}}{N_1} = \frac{f_{Band2}}{N_2} \qquad \text{Eq. 5}$$

and, therefore, $$\frac{f_{Band1}}{f_{Band2}} = \frac{N_1}{N_2} \qquad \text{Eq. 6}$$

Further, $$\omega_n^2 = \frac{I_{PD1} \cdot K_{VCO1}}{C \cdot N_1} = \frac{I_{PD2} \cdot K_{VCO2}}{C \cdot N_2} \qquad \text{Eq. 7}$$

Accordingly, $$\frac{I_{PD2}}{I_{PD1}} = \frac{\frac{K_{VCO1}}{N_1}}{\frac{K_{VCO2}}{N_2}} \qquad \text{Eq. 8}$$

Thus, the phase detector gain is controlled in accordance with Equation 8, preferably so that the frequency slope of each of the VCOs can be held as high as tolerated while still maintaining optimum PLL dynamics. If the frequency slopes of the VCOs are both maintained at maximum reliable slope and those values are relatively equal, i.e., $K_{VCO1}=K_{VCO2}$, then the ratio of Equation 8 reduces to;

$$\frac{I_{PD2}}{I_{PD1}} = \frac{N_2}{N_1} \qquad \text{Eq. 9}$$

By maintaining the natural frequency of the loop at the appropriate point for all of the potential operation bands, start up lock time can be kept to a minimum, oscillator frequency slope can be maximized without restriction, and the VCO control voltage levels can be kept low. Further, the close-in-phase-noise can be optimized. Also, the additional circuitry for accommodating multiple frequency bands is minimal.

Figure 3:
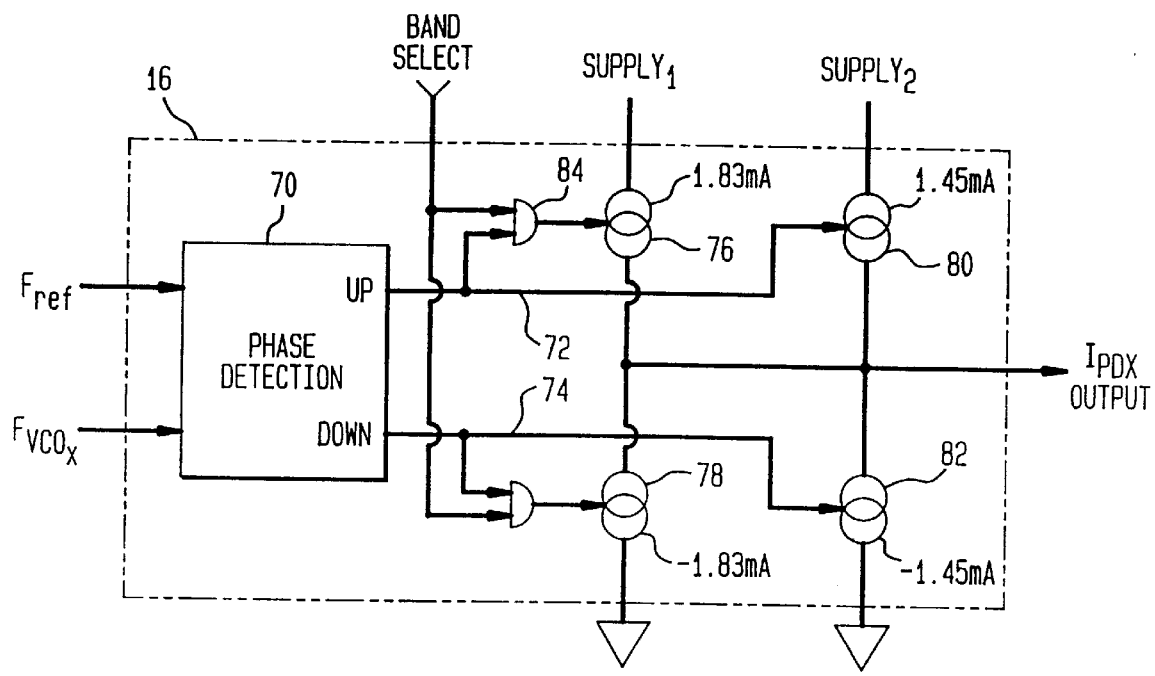
FIG. 3 is a more detailed diagram of the phase detector block in FIG. 1.

FIG. 3 is a circuit diagram of an exemplary phase detector with programmable current gain in accordance with the present invention. In a manner well known to those acquainted with the art, the phase detection portion 70 of the phase detector determines the difference in phase between the two input signals, $f_{ref}$ and $f_{VCOx}$ and outputs a pulse on either its UP output line 72 or its DOWN output line 74, depending on whether $f_{VCOx}$ is lagging or leading $f_{ref}$, respectively. The duration of the pulse is directly proportional to the magnitude of the phase difference.

Current sources 76, 78, 80 and 82 are turned on responsive to the pulses on lines 72 and 74. More particularly, current sources 76 and 80 are responsive to a pulse on UP line 72, while current sources 78 and 82 are responsive to a pulse on DOWN line 74. Even more particularly, current source 80 contributes 1.45 milliamps to the output of the phase detector and is controlled directly by the pulse on line 72. Current source 76 contributes about 1.83 milliamps to the output of the phase detector 16. However, AND-gate 84 only allows the control pulse on line 72 to reach current source 76 when the BAND SELECT signal is set to Band2 (1970 MHz). Thus, when Band1 is selected (and the VCO phase lags the reference phase), phase detector 16 generates an output signal for controlling the frequency of the VCO having a magnitude of 1.45 milliamps and a duration corresponding to the duration of the pulse on line 72. If Band2 is selected, the output has a magnitude of about 3.28 milliamps (i.e., the 1.45 milliamps from current source 80 plus the 1.05 milliamps from current source 76) for the duration of the current pulse. The current ratios, i.e., about 3.28 mA:1.45 mA, were selected assuming that the frequency slopes of the two VCOs are equal and thus, the current ratio should be equal to the $N_2:N_1$ ratio in accordance with equation 9 (2.2644:1 in the present example).

It should be apparent that current sources 78 and 82 operate in a parallel manner as that discussed above with respect to current sources 76 and 80, except that they are responsive to the pulses on DOWN line 74 rather than UP line 72.

Figure 4:
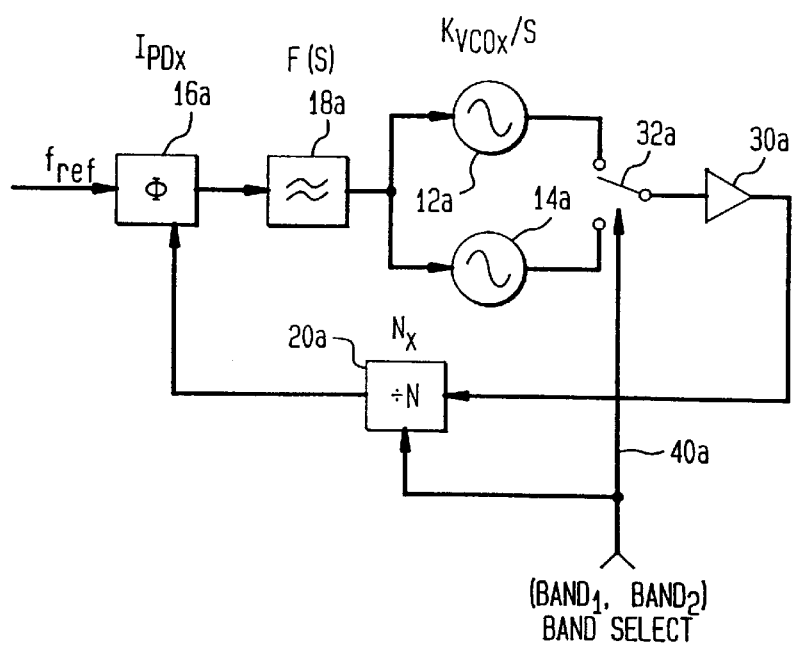
FIG. 4 is a block diagram of a phase locked loop in accordance with another embodiment of the present invention.

FIG. 4 is a block diagram of a second embodiment of the present invention. In this embodiment, the phase detector 16a is not programmable, but has a constant $I_{PD}$ value. Rather, the separate VCOs 12a and 14a have K values in accordance with Equation 10 below;

$$\frac{K_{VCO2}}{K_{VCO1}} = \frac{N_2}{N_1} \qquad \text{Eq. 10}$$

This embodiment is advantageous over the embodiment of FIG. 1 in that it further minimizes circuitry requirements since the phase detector need not be programmable. However, it is disadvantageous over the embodiment of FIGS. 1–3 in that the frequency slope $K_{VCO}$ of at least one of the VCOs cannot be maximized and/or one of the VCOs will require a much larger input voltage swing than the other. Either of these conditions is undesirable, particularly in a battery or solar operated device where it is advantageous to keep voltage requirements to a minimum in order to minimize power requirements.

Having thus described a few particular embodiments of the invention, various other alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed is:

1. A multi-band phase locked loop comprising:

a voltage controlled oscillator for selectively generating an oscillating output signal in a selected frequency band selected from a plurality of frequency bands within which said voltage controlled oscillator is capable of generating said oscillating output signal;

a frequency divider coupled to receive said oscillating output signal of said voltage controlled oscillator and divide said frequency thereof by a selected value to generate an output signal, said value being responsive to said selected frequency band;

a phase detector coupled to receive a reference signal and said output of said frequency divider, and generating an output signal indicative of the phase difference between said reference signal and said frequency divider output signal, said output signal being coupled to a voltage control input of said oscillator;

wherein said phase detector comprises a plurality of current sources and wherein selected ones of said plurality of current sources are enabled responsive to said selected frequency band such that a transfer function of said phase detector is selectively set responsive to said selected frequency band so as to maintain an approximately constant natural frequency of said phase locked loop regardless of the selected frequency band.

2. A multi-band phase locked loop as set forth in claim 1 wherein a transfer function of said voltage controlled oscillator is controlled relative to an overall transfer function of said phase locked loop so as to cause said phase locked loop to have approximately the same natural frequency regardless of the selected frequency band.

3. A multi-band phase locked loop as set forth in claim 1 further comprising a loop filter coupled between said phase detector and said voltage controlled oscillator.

4. A multi-band phase locked loop as set forth in claim 3 wherein said reference signal is generated by a crystal oscillator.

5. A multi-band phase locked loop as set forth in claim 1 wherein said phase detector further comprises:

a circuit for generating a directional signal indicating a direction of offset between the phase of said reference signal and the phase of said output of said frequency divider; and an AND-gate associated with at least one of said current sources, said AND-gate having an output coupled to said corresponding current source and further having inputs coupled to receive said directional signal and a signal indicative of the selected frequency band, said AND-gate selectively disabling said corresponding current source from responding to said directional signal when said signal indicative of the selected frequency band is in a first condition.

6. A multi-band phase locked loop comprising:

first and second voltage controlled oscillators, each for generating an oscillating output signal within first and second frequency bands, respectively, responsive to a signal at a voltage control input terminal thereof;

a switch, responsive to a band select control signal, for selectively coupling one of said first and second voltage controlled oscillators into said phase locked loop;

a frequency divider coupled to receive said oscillating output signal of said selected voltage controlled oscillator for generating an output signal that is a frequency divided version of said selected oscillating output signal; and a phase detector coupled to receive as inputs (1) a reference signal of a first frequency and (2) said output of said frequency divider and generating an output signal indicative of the phase difference between said reference signal and said frequency divider output signal, said output signal being coupled to said voltage control input terminal of said voltage controlled oscillators, and said phase detector having a transfer function that is controlled responsive to said band select control signal.

7. A multi-band phase locked loop as set forth in claim 6 wherein said transfer function of said phase detector is controlled relative to an overall transfer function of said loop so as to cause said loop to have approximately the same natural frequency regardless of the frequency band selected.

8. A multi-band phase locked loop as set forth in claim 7 further comprising a loop filter coupled between said phase detector and said voltage controlled oscillators.

9. A multi-band phase locked loop as set forth in claim 7 wherein said phase detector has a gain that is programmable responsive said band select control signal.

10. A multi-band phase locked loop as set forth in claim 9 wherein said phase detector comprises;

a phase detection unit for generating a pulse of a duration proportional to a difference between said phases of said reference signal and said frequency divider output signal;

a first current source coupled to generate a current of a first fixed magnitude responsive to said pulse; and a second current source coupled to generate a current of a second fixed magnitude responsive to said pulse and said band select control signal being in a first state.

11. A multi-band phase locked loop as set forth in claim 9 wherein said reference signal is generated by a crystal oscillator.

12. A multi-band phase locked loop as set forth in claim 7 wherein said phase detector comprises at least first and second positive current sources and first and second negative current sources and wherein only said first current sources are enabled when said band select signal is in a first state and wherein said first and second current sources are enabled when said band select signal is in a second state.

13. A multi-band phase locked loop as set forth in claim 12 wherein a current ratio of a current provided by said first current sources to a combined current of said first and second corresponding current sources is such that said phase locked loop has the same natural frequency regardless of which voltage controlled oscillator is selected by said switch.

14. A multi-band phase locked loop as set forth in claim 13 wherein:

each of said voltage controlled oscillators has the same transfer function;

said frequency divider also is responsive to said band select signal to divide said frequency of said oscillating output signal by a first division factor responsive to said band select signal being in a first state and to divide said frequency of said oscillating output signal by a second division factor responsive to said band select signal being in a second state; and said ratio of said current provided by said first current sources to said combined current of said first and second corresponding current sources is equal to a ratio of said first division factor to said second division factor.

15. A multi-band phase locked loop as set forth in claim 14 wherein said phase detector further comprises:

a circuit for generating a directional signal indicating a direction of offset between the phase of said reference signal and the phase of said output of said frequency divider; and an AND-gate corresponding to each of said second current sources, each of said AND-gates having a first input coupled to said directional signal and a second input coupled to said band select signal and an output coupled to said corresponding second current source such that said corresponding second current source is enabled responsive to said band select signal being in said second state and said directional signal being in a corresponding state.

16. An integrated circuit having a multi-band phase locked loop, said integrated circuit comprising:

first and second voltage controlled oscillators, each for generating an oscillating output signal within first and second frequency bands, respectively, responsive to a signal at a voltage control input terminal thereof;

a switch, responsive to a band select control signal, for selectively coupling one of said first and second voltage controlled oscillators into said phase locked loop;

a frequency divider coupled to receive said oscillating output signal of said selected voltage controlled oscillator for generating an output signal that is a frequency divided version of said selected oscillating output signal; and a phase detector coupled to receive as inputs (1) a reference signal of a first frequency and (2) said output of said frequency divider and generating an output signal indicative of the phase difference between said reference signal and said frequency divider output signal, said output signal being coupled to said voltage control input terminal of said voltage controlled oscillators, and said phase detector having a transfer function that is controlled responsive to said band select control signal.

17. An integrated circuit as set forth in claim 16 wherein said transfer function of said phase detector is controlled relative to an overall transfer function of said loop so as to cause said loop to have approximately the same natural frequency regardless of the frequency band selected.

18. An integrated circuit as set forth in claim 17 further comprising a loop filter coupled between said phase detector and said voltage controlled oscillators.

19. An integrated circuit as set forth in claim 17 wherein said phase detector has a gain that is programmable responsive said band select control signal.

20. A integrated circuit as set forth in claim 19 wherein said phase detector comprises;
- a phase detection unit for generating a pulse of a duration proportional to a difference between said phases of said reference signal and said divider output signal;
- a first current source coupled to generate a current of a first fixed magnitude responsive to said pulse; and
- a second current source coupled to generate a current of a second fixed magnitude responsive to said pulse and said band select control signal being in a first state.

21. An integrated circuit as set forth in claim 19 wherein said reference signal is generated by a crystal oscillator.

22. A multi-band phase locked loop comprising:
- first and second voltage controlled oscillators for generating an oscillating output signal of said phase locked loop, said first oscillator for generating an output signal in a first frequency band and said second oscillator for generating an output signal in a second frequency band;
- a switch, responsive to a band select control signal, for selectively coupling one of said first and second voltage controlled oscillators into said phase locked loop;
- a frequency divider coupled to receive said oscillating output signal of said selected voltage controlled oscillator; and
- a phase detector coupled to receive a reference signal and an output signal of said frequency divider and generating an output signal indicative of the phase difference between said reference signal and said frequency divider output signal, said output signal being coupled to said selected voltage controlled oscillator, and said phase detector having a transfer function that is controlled responsive to said band select control signal.

23. A method of maintaining a particular natural frequency of a multi-band phase locked loop capable of selectively operating in one of a plurality of frequency bands, said phase locked loop comprising at least an oscillator and a phase detector for comparing a phase of said oscillator with a phase of a reference signal, said method comprising the steps of:
- switching said phase locked loop to generate an output signal in one of said plurality of frequency bands;
- changing a transfer function of said phase detector responsive to the one of said plurality of frequency bands within which said phase locked loop is operating such that said natural frequency of said phase locked loop is a specified value for all of said frequency bands; and
- wherein said phase detector comprises a plurality of current sources for generating currents for controlling said oscillator and wherein said changing step comprises selectively enabling one or more of said current sources responsive to said frequency band.

24. A method as set forth in claim 23 wherein said phase locked loop comprises a plurality of said oscillators and wherein said oscillators are voltage controlled oscillators, each of said voltage controlled oscillators capable of generating said phase locked loop output signal in one of said frequency bands, and a switch for selectively coupling one of said voltage controlled oscillators to generate said phase locked loop output signal and wherein;
- said switching step comprises operating said switch.

25. A method as set forth in claim 24 wherein said phase locked loop further comprises a frequency divider, a division ratio of which is controlled as a function of the one of the frequency bands selected, and wherein;
- said changing step comprises changing said transfer function of said phase detector as a function of said division ratio for each of said bands.

26. A method of maintaining a particular natural frequency of a multi-band phase locked loop capable of selectively operating in one of a plurality of frequency bands, said phase locked loop comprising at least an oscillator and a phase detector for comparing a phase of said oscillator with a phase of a reference signal and generating an UP current signal if said phase of said oscillator leads said phase of said reference signal and a DOWN current signal if said phase of said oscillator lags said phase of said reference signal, said oscillator generating a signal having a frequency that is controlled by said UP and DOWN currents of said phase detector, said method comprising the steps of:
- selecting one of said plurality of frequency bands: and
- changing a transfer function of said phase detector as a function of the selected frequency band such that said natural frequency of said phase locked loop is a specified value for all of said frequency bands;
- wherein said phase detector comprises a plurality of current sources for generating each of said UP and DOWN currents and wherein said changing step comprises selectively enabling one or more of said current sources as a function of said selected frequency band in order to set a magnitude of said UP and DOWN current signals as a function of said selected frequency band.

* * * * *